United States Patent [19]

Dean et al.

[11] Patent Number: 5,091,103

[45] Date of Patent: Feb. 25, 1992

[54] PHOTORESIST STRIPPER

[76] Inventors: Alicia Dean, 11 Robin Hill; John A. Fitzsimmons, 51 Skyview Dr., both of Poughkeepsie, N.Y. 12603; Janos Havas, Larchmont Dr., Hopewell Junction, N.Y. 12533; Barry C. McCormick, 12 Patricia Rd., Poughkeepsie, N.Y. 12603; Prabodh R. Shah, 5 Sherrywood Rd., Wappingers Falls, N.Y. 12590

[21] Appl. No.: 517,105

[22] Filed: May 1, 1990

[51] Int. Cl.$^5$ .................... C09D 9/00; C11D 7/50; C11D 7/32
[52] U.S. Cl. ........................ 252/162; 252/153; 252/156; 252/158; 252/170; 252/172; 252/DIG. 8
[58] Field of Search ............... 252/DIG. 8, 156, 158, 252/170, 172, 153, 162

[56] References Cited

U.S. PATENT DOCUMENTS 3,673,099  6/1972  Corby et al. ................ 252/156
4,906,303  3/1990  Freis ....................... 252/DIG. 8

Primary Examiner—Paul Lieberman
Assistant Examiner—William S. Parks
Attorney, Agent, or Firm—John A. Stemwedel

[57] ABSTRACT

Photo resist stripper compositions comprising N-alkyl-2-pyrrolidone, 1,2-propanediol and tetraalkylammonium hydroxide. The photoresist strippers are useful at high stripping temperatures (105° C.–125° C.) to remove hard baked photoresist without damaging semiconductor substrates or metallurgy.

24 Claims, No Drawings

PHOTORESIST STRIPPER

FIELD OF INVENTION

The present invention relates to compositions of matter which are useful for removing hard baked photoresist compositions from substrates and to methods of effectively stripping photoresists from such substrates using the compositions of matter of the ainvention. The substrates may be semiconductor devices or packages which are susceptible to corrosion and chemical attack.

BACKGROUND ART

Integrated circuit technology utilizes photoresist compositions which generally comprise a polymeric resin or binder compound, a radiation sensitive compound, and a suitable solvent to enable forming a film of the composition over a particular substrate for photolithographically delineating patterns on such substrate. In a typical processing scheme, the photoresist compositions are spun on or applied with different methods known in the art to the substrate. Then the photoresist compositions are subjected to a pre-exposure bake to drive off a proportion of the solvent to impart dimensional stability to the film. The coated substrate is exposed with actinic radiation, usually in the UV, e-beam or x-ray spectra, using an appropriate exposure tool for such exposure. After exposure, the coated substrate undergoes a development process where, due to selective dissolution of certain areas, a pattern is formed or developed. In certain areas of the photoresist film, the resist material is completely removed while in other areas the remaining photoresist forms a pattern having a desired or intended configuration. Such patterns are used to mask or protect the substrate for subsequent wet or dry etching processes, the deposit of conductor or insulator patterns, or for incorporation of the patterned photoresist into the device or package as, for example, an insulating or passivating layer.

The remaining resist material is further exposed to dry or wet etching. This process is essential to define or transfer the pattern and to enable further processing such as the deposition of dielectric or metallic film to be patterned by, for example, a lift-off or polishing step later on in the process sequence. Before this etching process the photoresist materials may be treated with a blanket exposure with deep UV radiation, at very high temperatures ranging from 140° to 300° C. for 30 seconds to 90 seconds. This treatment improves the resist selectivity and provides better etching and dimensional controls.

It is necessary in a comprehensive lithographic process that the photoresist material, following pattern delineation, be evenly and completely removed in certain areas and retained in others, in order to permit further operations. Any portion of photoresist remaining in a region of desired removal for such processing may cause deleterious results. Photoresist residues can lead to defects which are detrimental to yield.

In the past, resist materials have been removed by one or more of the following: halogenated hydrocarbons, such as methylene chloride or tetrachloroethylene; amines and their derivatives, such as dimethylformamide, N-methyl-2-pyrrolidone; glycol ethers such as ethylene glycol monomethyl ether, ethanol and the acetates thereof; ketones such as methyl ethyl ketone and acetone; and materials such as isopropyl alcohol, sulfuric acid, ammonium persulfate, dioxane, and mixtures or caustic and phenol derivatives as well as various other materials. These various agents suffer one or more disadvantages such as potential toxicity to workers exposed to such materials, environmental and pollution problems after use, volatility, corrosion of equipment, and the safety hazards inherent in operating at temperatures above the flash point of the stripper. Additionally, as the ground rules on semiconductor devices and packaging call for an even greater degree of integration, the presence of even traces of resist materials has become less tolerable. Therefore, processing with strippers heretofore known has involved metal attack and/or attack of the silicon substrate itself. The presence of water and/or high temperatures (>100° C.) exacerbate such attacks.

Processing conditions for resists such as high temperature post exposure bake or pattern generation, the use of techniques such as ion implantation (e.g., boron ion implantation and the like), and deep ultraviolet radiation hardening lead to highly crosslinked resists which are extremely resistant to dissolution in most organic solvent strippers conventionally employed in the art. Particularly tenacious compositions containing phenolic or chlorinated hydrocarbon solvents have been employed at elevated temperatures to strip such resists. Such extreme measures are clearly undesireable since they involve considerable hazard to technicians carrying out the stripping as well as presenting potential pollution and environmental problems in the disposal of the resulting waste products. These chlorinated solvent-containing compositions are particularly sensitive to the presence of water which forces the equilibrium to shift to a higher chloride ion concentration in solution which causes metal attack. Aqueous solutions of strong bases have the deleterious side effect of exhibiting aggressive metal attack as well as having an etchant effect on silicon substrate and the like.

The art is replete with attempts to provide improved stripper compositions which have been designed to meet the deficiencies that their inventors perceived. Among the solutions are included the following:

U.S. Pat. No. 4,744,834 is directed to compositions useful for removing photoresists from substrates comprising 10-90% of a 2-pyrrolidone which may be N-alkyl or N-hydroxyalkyl substituted where the alkyl portion has 1-3 carbons, 10-30% of diethylene glycol monoalkyl ether where the alkyl group has 1-4 carbons, 1-10% of a polyglycol having a molecular weight from about 200-600, and 0.5-4% of a quaternary ammonium hydroxide of the form $NR_3R_4R_5R_6$ where patterns $R_3$ and $R_4$ are the same or different alkyl groups of 1-4 carbon atoms, $R_5$ is an alkyl group of 1-18 carbon atoms, and $R_6$ is an alkyl group of 1-18 carbon atoms, phenyl, benzyl, alkylphenyl, or alkylbenzyl where the alkyl portion has 1-18 carbons. The compositions of this reference were shown to be useful in the removal of photoresist which was hard baked at 125° C. (a range of 120°-300° C. is given) by use of the stripping solution at 90° C.

U.S. Pat. Nos. 4,395,479, 4,401,748 and 4,428,871 are directed to 2-pyrrolidone based stripping compositions which include a tetrahydrothiophene-1,1-dioxide, a tetrahydrofuran, or a diethylene glycol monoalkyl ether respectively to provide improved stripping results. These compositions may also preferably include propylene glycol and a diethylene glycol monoalkyl ether in the case of the first two compositions.

U.S. Pat. Nos. 4,765,844 is directed to resist stripper compositions comprising 10–100% of a difunctional water-soluble amino derivative which is either a diamino or an amino hydroxy compound and 0–90% of a propylene glycol derivative.

U.S. Pat. No. 4,776,892 discloses processes for removing photoresist compositions from a substrate including the use of an aqueous solution containing an organic quarternary ammonium base, preferably tetramethylammonium hydroxide (TMAH). The solutions may also contain a strong inorganic base. The stripping is generally carried out at an elevated temperature of 30°–70° C.

U.S. Pat. No. 3,673,099 is directed to resist stripping compositions and processes which provide a composition comprising a mixture of N-methyl-2-pyrrolidone (NMP), and a strong base such as an alkyl or substituted alkyl ammonium hydroxide. Miscible organic solvents such as ethylene glycol monomethyl ether may also be included. The method is practiced at from 25° C. to the boiling point of the stripping composition.

U.S. Pat. No. 3,706,691 is directed to solvents to dissolve potting (encapsulating) compositions having bond susceptible of hydrolytic cleavage (e.g., polyamides, polyesters, and polyester base type polyurethanes) which comprise benzyltrimethylammonium hydroxide and a constituent selected from the group of (a)tetrahydrofuran and acetone, (b) methylene chloride, (c) methylene chloride and acetone, and (d) N-methyl-2-pyrrolidone.

U.S. Pat. No. 4,239,661 discloses aqueous stripping solutions containing 0.01–20% by weight of trialkyl(hydroxy-alkyl) ammonium hydroxide (THAH) where the alkyl groups have 1–4 carbons and the alkylene portion of the hydroxyalkyl has 2–4 carbons. The THAH solution is very basic and dissolves alkali metals and aluminum and etches silicon oxide.

U.S. Pat. No. 4,617,251 is directed to a stripping composition that is free of phenol compounds and of halogenated hydrocarbon compounds because of the toxicity and disposal problems that accompany such materials. The stripper compositions comprise an amine and an organic polar solvent with a boiling point greater than 140° C.

PCT publication WO 88/05813 (based on PCT application PCT/US87/02291) discloses photoresist stripper compositions comprising a mixture of (a) pyrrolidone, N-substituted pyrrolidone, butyrolactone or caprolactone and (b) about 2–10% by weight of a tetraalkylammonium hydroxide or a trialkylaralkylammonium hydroxide. The ratio of the component from (a) to the component from (b) is from 50:1 to 4:1. Optional ingredients include surfactants and diluents which may include polar organic solvents such as glycols, e.g., ethylene glycol, propylene glycol, dipropylene glycol, tripropylene glycol, tetrapropylene glycol, etc.

SUMMARY OF THE INVENTION

The present invention provides improved resist stripper compositions which are highly effective in removing hard baked photoresist compositions from substrates while at the same time being "nonreactive" to the substrate and any metallization or dielectric features which compositions may be used at elevated temperatures.

The present invention further provides improved resist stripper compositions which may be used in processes involving metallization of pins and studs.

The present invention also provides improved resist stripper compositions which do not expose personnel handling such compositions to any significant toxicity hazards and which have minimal ecological impact due to the nature of spent stripper, compositions and the potential to economically recycle such spent solutions.

The present invention additionally provides compositions which enable improved surface cleaning. Such improved surface cleaning may be utilized before application of photoresist or deposition of insulators such polymide, silicon nitride or quartz. The cleaned surface, enhance adhesion and film or layer uniformity.

The resist stripper compositions of the present invention comprise 60 to 90% by weight of 1,2-propanediol, and a sufficient amount of a tetraalkylammonium hydroxide to provide a solution being from 0.1 to 0.22 N. It is more preferred that the resist stripper compositions comprise 65 to 85% by weight of N-alkyl-2-pyrrolidone, 15 to 35% by weight of 1,2-propanediol, and sufficient tetraalkylammonium hydroxide to provide a 0.12 to 0.20 N solution. In its most preferred embodiment, the resist stripper compositions comprise 70 to 80% by weight of N-alkyl-2-pyrrolidone 20 to 30% by weight 1,2-propanedrol and sufficient tetraalkylammonium hydroxide to give a 0.16 to 0.18 N solution.

While the compositions and process of the present invention may be employed to strip a wide variety of resist materials from a wide variety of substrates known in the art, they are particularly adapted for use in stripping photoresists from wafers employed in fabrication of microelectronic circuitry. Illustrative of the later substrates are silicon wafers whose surfaces have been treated to form layers of silicon oxide, aluminum, alloys of aluminum with copper and like metals, chromium, chromium alloys, silicon nitride and the like.

DETAILED DESCRIPTION

As is set forth above, the resist stripper compositions of the present invention comprise 60 to 90% by weight of an N-alkyl-2-pyrrolidone, 10 to 40% by weight of 1,2-propanediol, and a sufficient amount of a tetraalkylammonium hydroxide to provide a solution being from 0.1 to 0.22 N. It is more preferred that the resist stripper compositions comprise 65 to 85% by weight of N-alkyl-2-pyrrolidone, 15 to 35% by weight of 1,2-propone diol, and sufficient tetraalkylammonium hydroxide to provide a 0.12 to 0.20 N solution. In its most preferred embodiment, the resist stripper compositions comprise 70 to 80% by weight of N-alkyl-2-pyrrolidone, 20 to 30% by weight 2,2-propanedrol and sufficient tetraalkylammonium hydroxide to give a 0.16 to 0.18 N solution.

In order to determine the usefulness of certain commercial strippers in removing hard-baked, phenol-formaldehyde (novolak) photoresist the following strippers were evaluated:

American Hoechst AZ 300T
KTI R-10
J.T. Baker PRS-1000
NMP
NMP/Imidazole
NMP/MMO*
* MMO = methyl morpholine oxide At 100° C., none of these strippers worked as well as J-100, a stripper composition containing phenols and chlorinated organics. AZ 300T provided the most acceptable performance of the non-chlorinated, non-phenolic ecologically soundstrippers. In order to increase the effectiveness of AZ 300T in removing photoresist, the bath temperature was increased to 125° C. Removal of photoresist was more efficient than achieved with J-100, but the heated AZ 300T also etched silicon making it unacceptable for semiconductor processing.

EXAMPLE A (COMPARATIVE)

A commercial stripping composition, Indust-ri-chem J-100, was analyzed and found to have the following approximate composition:

| Component | Approx. % by wt. |
|---|---|
| perchloroethylene | 35 |
| o-dichlorobenzene | 35 |
| phenol | 10 |
| alkylaryl sulfonic acids | 20 |

This composition has been used to effectively strip photoresist from silicon.

The J-100 Composition (Example A) is an acid solution which is not water soluble and must be solvent rinsed in a cascade of individual solvent tanks to permit an eventual water rinse of the product processed through such solution. J-100 is both a poison (phenol) and an environmentally difficult waste to dispose of (organic acid, chlorinated solvents, phenol). J-100 is known to attack metal on semiconductor devices. Prolonged immersion and the addition of water have been shown to initiate metal attack. J-100 has not shown any propensity towards silicon attack. J-100 comes under guidelines requiring the elimination of chlorinated organic solvents due to atmospheric concerns (Ozone). This composition does not show any aggressive etch-type behavior towards silicon dioxide or silicon nitride. J-100 is unable to remove 220° C. postbaked novolak resist to produce a consistently clean surface. The odor of the J-100 composition, being detectable at very low concentrations, can function as an indicator that chemical exhaust systems are functioning properly. This prevents hazardous build ups. J-100 is very sensitive to the presence of water and, when contaminated, decomposes releasing chloride ion and protonated acids. Chloride corrosion of metal will destroy any product processed using the J-100 if sufficient composition water is present. The bath life is related to the number of wafers processed through the bath as well as the thermal effects such as evaporation which will change its formulation.

EXAMPLE B (COMPARATIVE)

A commercial stripping composition, AZ 300T Photoresist Stripper, from the Electronics Products Division, Hoechst Celanese Corporation, was analyzed and found to have the following approximate composition:

| Component | % by wt. |
|---|---|
| N-methyl-2-pyrrolidone | 54.5 |
| 1,2-propanediol | 42.2 |
| tetramethylammonium hydroxide | 3.3 |

The TMAH was present to give the solution a 0.369 N strength. This stripper has been found to attack both single crystal and polycrystalline silicon at the elevated temperatures needed to remove novolak resist which has been postbaked to 220° C.

EXAMPLE 1

An experimental stripper composition was prepared with the following approximate composition:

| Component | % by wt. |
|---|---|
| N-methyl-pyrrolidone | 73.8 |
| 1,2-propanediol | 24.6 |
| tetramethylammonium hydroxide | 1.6 |

The TMAH was present in an amount sufficient to give a 0.19 N solution.

This stripper is a basic solution which can be either water rinsed with or without an intervening solvent cascade. A process which uses a water quick-dump after the stripper is most preferred as well as being simplest to implement. This stripper is comprised of components having low toxicity which will clean to the level required for the product. The spent solution is easily disposed of through either sale on the spent solvent market or biodegradation. This stripper has not attacked metal even with the intentional addition of 0.7% water and prolonged immersion in the solution. This stripper was formulated to allow photoresist attack without producing attack of the silicon used in semiconductor manufacture. Since this stripper is free of chlorinated solvents, it does not present a hazard to the ozone layer. This stripper does not change or decompose upon the limited addition of water to produce damaging decomposition products. The bath life of this stripper is a very strong function of the time at temperature and is independent of the number of wafers processed through the stripper. Since the boiling points of the components of the solvent system are very high and quite close, the solvent balance does not change during normal operation to any significant extent. This stripper composition was extremely effective in removing photoresist residue, does not etch silicon, does not etch insulator, does not attack contacts, does not attack metal, and does not affect sheet resistivity. The stripper did not prove effective in the removal of rubber-based photoresists.

Compative Processing

J-100 stripper and pure NMP, AZ 300T and the composition of the invention were used to remove novolak resist (AZ 1350J or Shipley SC 1350J) hard baked to 220 C from silicon wafers using the following bath times and temperatures:

| Time | J-100 Bath | Temperature |
|---|---|---|
| 15 min | J-100 | 100° C. |
| 5 min | NBA* | ambient |
| 5 min | NBA* | ambient |
| 5 min | IPA** | ambient |
| 5 min | IPA | ambient |
| quick dump | water | ambient |
| overflow rinse | water | ambient |
| spin dry | | |

*NBA = n-butyl acetate
**IPA = isopropyl alcohol

| Time | Bath | Temperature |
|---|---|---|
| | Pure NMP | |
| 25 min | NMP | 100° C. |
| quick dump | water | ambient |
| over flow rinse | water | ambient |
| spin dry | | |
| | AZ 300 T | |
| 20 min | Stripper | 100° C. |
| 5 min | NMP | ambient (optional) |
| quick dump | water | ambient |
| overflow rinse | water | ambient |
| spin dry | | |
| | Example 1 Composition | |
| 20 min | stripper | 125° C. |
| 5 min | NMP | ambient (optional) |
| quick dump | water | ambient |
| overflow rinse | water | ambient |
| spin dry | | |

All baths were maintained in a static condition since agitation can induce mechanical damage to fine structures.

Results

J-100 produced inconsistent cleaning/removal. Most times large areas of resist remained.

NMP did not remove the resist. The only effect was causing the resist film to wrinkle.

AZ 300T would not remove the resist if the stripper bath was below 120° C. Above 120° C., the AZ 300 T would remove the resist, but silicon attack was clearly visible to the unaided eye. We could not find a condition where AZ 300T would produce a consistently clean surface without etching the silicon wafer.

The stripper composition of the invention removed the hardbaked novolak resist above 120° C without silicon attack.

We claim:

1. A composition of matter useful for removing hard baked photoresist compositions from a substrate comprising essentially of
   60 to 90% by weight of an N-alkyl-2-pyrrolidone, 10 to 40% by weight of 1,2-propanediol, and a sufficient amount of a tetraalkylammonium hydroxide to provide a solution being from 0.1 to 0.22 N.

2. The composition of claim 1 wherein the N-alkyl-2-pyrrolidone is N-methyl-2-pyrrolidone.

3. The composition of claim 1 wherein the N-alkyl-2-pyrrolidone is present in an amount from 65 to 5%.

4. The composition of claim 1 wherein the N-alkyl-2-pyrrolidone is present in an amount from 70 to 80%.

5. The composition of claim 1 wherein the 1,2-propanediol is present in an amount from 15 to 35%.

6. The composition of claim 1 wherein the 1,2-propanediol is present in an amount from 20 to 30%.

7. The composition of claim 1 wherein the tetraalkylammonium hydroxide is tetramethylammonium hydroxide.

8. The composition of claim 1 wherein the tetraalkylammonium hydroxide is present in an amount sufficient to provide a solution from 0.12 to 0.20 N.

9. The composition of claim 1 wherein the tetraalkylammonium hydroxide is present in an amount sufficient to provide a solution from 0.16 to 0.18 N.

10. A method for removing a hard baked photoresist composition from a substrate without damage to the substrate comprising the steps of
    contacting the hard baked photoresist composition with a stripper composition consisting essentially of 60 to 90% by weight of an N-alkyl-2-pyrrolidone, 10 to 40% by weight of 1,2-propanediol, and a sufficient amount of a tetraalkylammonium hydroxide to provide a solution being from 0.1 to 0.22N,
    maintaining the stripper composition at from 105° to 135° C. for more than 15 minutes while in contact with said hard-baked photoresist, and rinsing the substrate.

11. The method of claim 10 wherein the substrate has patterned metallurgy.

12. The method of claim 10 wherein the stripper composition is maintained at a temperature of 120° to 125° C.

13. The method of claim 11 wherein the metallurgy is not attacked by the stripper composition.

14. The method of claim 10 wherein the N-alkyl-2-pyrrolidone is N-methyl-2-pyrrolidone.

15. The method of claim 10 wherein the stripper composition comprises 65 to 85% by weight N-alkyl-2-pyrrolidone.

16. The method of claim 10 wherein the stripper composition comprises 70 to 80% by weight or N-alkyl-2-pyrrolidone.

17. The method of claim 10 wherein the stripper composition comprises 15 to 35% by weight of 1,2-propanediol.

18. The method of claim 10 wherein the stripper composition comprises 20 to 30% by weight of 1,2-propanediol.

19. The method of claim 10 wherein the stripper composition comprises sufficient tetraalkylammonium hydroxide to provide a 0.12 to 0.2 N solution.

20. The method of claim 10 wherein the stripper composition comprises sufficient tetraalkylammonium hydroxide to provide a 0.16 to 0.18 N solution.

21. The method of claim 10 wherein the tetraalkylammonium hydroxide is tetramethyl ammonium hydroxide.

22. A method for precleaning semiconductor substrates prior to photoresist deposition whereby the semiconductor substrates are contacted with the composition of claim 1.

23. A method for precleaning semiconductor substrates prior to insulator deposition whereby the semiconductor substrates are contacted with the composition of claim 1.

24. The method of claim 23 wherein the insulator is selected from the group of polyimide, silicon nitride and quartz.

* * * * *

UNITED STATES PATENT AND TRADEMARK OFFICE
CERTIFICATE OF CORRECTION

PATENT NO. : 5,091,103

DATED : February 25, 1992

INVENTOR(S) : Alicia Dean, John A. Fitzsimmons, Janos Havas, Barry C. McCormick, and Prabodh R. Shah It is certified that error appears in the above-identified patent and that said Letters Patent is hereby corrected as shown below:

At Column 4, line 14, after "60 to 90% by weight," please insert:

--of an N-alkyl-2-pyrrolidone, 10 to 40% by weight--

At Column 7, line 43, in claim 1 (third line of claim), after "from a Substrate", please delete "comprising" and substitute therefore "consisting".

At Column 7, line 52, in claim 3 (second line of claim), after "amount from 65 to" please delete "5" and substitute therefore "85".

Signed and Sealed this

Twenty-first Day of December, 1993

Attest:

BRUCE LEHMAN

Attesting Officer

Commissioner of Patents and Trademarks